United States Patent
Tanizaki et al.

(10) Patent No.: US 6,333,869 B1
(45) Date of Patent: Dec. 25, 2001

(54) SEMICONDUCTOR MEMORY DEVICE WITH READILY CHANGEABLE MEMORY CAPACITY

(75) Inventors: Hiroaki Tanizaki; Shigeki Tomishima, both of Hyogo (JP)

(73) Assignees: Mitsubishi Denki Kabushiki Kaisha; Mitsubishi Electric Engineering Company Limited, both of Tokyo (JP)

(*) Notice: Subject to any disclaimer, the term of this patent is extended or adjusted under 35 U.S.C. 154(b) by 0 days.

(21) Appl. No.: 09/754,121

(22) Filed: Jan. 5, 2001

(30) Foreign Application Priority Data

Jul. 6, 2000 (JP) ................................. 12-204821

(51) Int. Cl.[7] .......................... G11C 5/06; G11C 8/00
(52) U.S. Cl. ................ 365/63; 365/230.06; 365/230.03
(58) Field of Search .................... 365/63, 230.03, 365/230.06, 230.09, 207

(56) References Cited

U.S. PATENT DOCUMENTS 5,894,448 * 4/1999 Amano et al. ............... 365/230.08
5,956,285 * 9/1999 Watanabe et al. ............ 365/230.03
6,072,743 * 6/2000 Amano et al. ............... 365/230.03
6,091,659 * 7/2000 Watanabe et al. ............ 365/230.03

FOREIGN PATENT DOCUMENTS 10-256512    9/1998   (JP) .

OTHER PUBLICATIONS

"Ultra LSI Memory", by Kiyoo Ito, Advanced Electronics Series, I–9, pp. 132–141.

* cited by examiner

*Primary Examiner*—Amir Zarabian
*Assistant Examiner*—Anh Phung
(74) *Attorney, Agent, or Firm*—McDermott, Will & Emery

(57) ABSTRACT

First and second memory cell arrays have their respective sides with first and second center circuit bands adjacent thereto, respectively, and provided therein with their respective address latch circuits, row predecode circuits and row decoders. The first and second memory cell arrays share a sense amplifier band having a side with a center cross circuit band adjacent thereto and provided therein with a column decode circuit and a sense amplifier control circuit controlling activating a sense amplifier. As such the number of signal lines between the second center circuit band and the center cross circuit band can be reduced to alleviate thick density of signal lines. Thus there can be provided a DRAM core with readily changeable memory capacity.

10 Claims, 14 Drawing Sheets

SEMICONDUCTOR MEMORY DEVICE WITH READILY CHANGEABLE MEMORY CAPACITY

BACKGROUND OF THE INVENTION

1. Field of the Invention

The present invention relates generally to semiconductor memory devices and particularly to semiconductor memory devices with a memory block mounted thereon together with a logic circuit and thus used.

2. Description of the Background Art

There is a system LSI developed with a large-capacity dynamic random access memory (DRAM) and a large-scale logic circuit mounted thereon in a mixed manner. Such a system LSI has been materialized attributed to the recent advance of semiconductor microprocessing technology. It can incorporate a DRAM therein and have a memory bus width in a chip thereof that is extended without any limitation imposed thereon by an external terminal. For example, a bus width extended from 16 bits, as conventional, to multiple bits of 128–256 bits allows data to be rapidly transferred and digital devices to provide high performance and operate with reduced power consumption.

Such a system LSI as described above is often produced as an application-specific IC (ASIC). For the ASIC, a DRAM incorporated therein is required to have a core having a different memory capacity depending on the application.

FIG. 12 illustrates an arrangement of a circuit block having arranged therein a conventional DRAM core's memory cell array and sense amplifier.

As shown in FIG. 12, on opposite sides of a memory cell array MA#2 there are provided sense amplifier bands SAB#2 and SAB#3. On a side of sense amplifier band SAB#2, memory cell array MA#2 and sense amplifier band SAB#3 there are provided a column select control circuit 502, a row select control circuit 504, and a column select control circuit 506, respectively. Sense amplifier band SAB#2, memory cell array MA#2 and sense amplifier band SAB#3 are adjacent to square regions, respectively, which will be referred to as a center cross circuit band CCCB#2, a center circuit band CCB#2 and a center cross circuit band CCCB#3, respectively. As such, column select control circuit 502, row select control circuit 504 and column select control circuit 506 exist internal to center cross circuit band CCCB#2, center circuit band CCB#2 and center cross circuit band CCCB#3, respectively.

FIG. 13 is a block diagram for illustrating a signal input to the FIG. 12 center cross circuit band CCCB#2.

With reference to FIG. 13, center circuit band CCB#1 includes a row predecode circuit 514, an address latch circuit 512, a row decoder 516 and a sense amplifier control circuit 518.

Center circuit band CCB#2 includes a row predecode circuit 524, an address latch circuit 522, a row decoder 526 and a sense amplifier control circuit 528. Row predecode circuit 524, address latch circuit 522, row decoder 526 and sense amplifier control circuit 528 correspond to the FIG. 12 row select control circuit 504.

Center cross circuit band CCCB#2 is provided with a row decode circuit 520. Row decode circuit 520 corresponds to the FIG. 12 column select control circuit 502.

Row decoders 516 and 526 output to their respective adjacent memory cell arrays a signal MWLD<m:0> driving a main word line to select a memory cell row. In response to signal MWLD<m:0>, a memory cell array has a word line activated.

In response to a memory cell row having been selected, sense amplifier control circuit 528 connects a sense amplifier to a bit line and activates the sense amplifier. As such, conventionally, together with row predecode circuit 524 and row decoder 526 which are common in providing a row address processing, sense amplifier control circuit 528 is arranged as the FIG. 12 row select control circuit 504 in center circuit band CCB#2 corresponding to a region adjacent to a memory cell array.

As such, sense amplifier control circuit 528 outputs a bit line equalization signal and a bit line isolation signal to both of sense amplifier band SAB#2 arranged between memory cell arrays MA#2 and MA#1 and a sense amplifier band SAB#3 (not shown). Furthermore, sense amplifier control circuit 528 outputs a sense amplifier activation signal SE, /SE to sense amplifier band SAB#2.

FIG. 14 is a circuit diagram showing a configuration of the FIG. 13 address latch circuit 522.

As shown in FIG. 14, address latch circuit 522 includes a latch circuit 532 latching a signal XBLK<n> in synchronization with a signal XLAT<bankn>, a latch circuit 534 latching a signal XBLK<n–1> in synchronization with signal XLAT<bankn>, and a latch circuit 536 latching a row address signal RA<k:0> in synchronization with signal XLAT<bankn>.

Latch circuit 532 outputs a signal XBLATL indicating that when memory cell array #n is selected, sense amplifier bands SAB#n and SAB#n+1 are connected to memory cell array #n to use a sense amplifier.

Latch circuit 534 outputs a signal XBLATR for activating a sense amplifier of sense amplifier band SAB#n when memory cell array #n–1 is selected.

Furthermore, latch circuit 536 holds and outputs a row address signal RALAT<k:0> input in response to a memory block having been selected. Row address signal RALAT<k:0> is input to and predecoded in the FIG. 13 row predecode circuit 524. The predecoded signal is fed to row decoder 136 to activate any one of signal MWLD<m:0> for driving a word line. Note that signal XBLK<n> corresponds to signal XBLK<2>.

Address latch circuit 512 is similar in configuration to the FIG. 14 address latch circuit 522 and a description thereof will thus not be repeated, although for address latch circuit 512, signal XBLK<n> corresponds to signal XBLK<1>.

FIG. 15 is a circuit diagram showing a configuration of the FIG. 13 row decode circuit 520.

As shown in FIG. 15, row decode circuit 138 includes an AND circuit 542 receiving a bank select signal YBANK<n> and a signal XBLATL output from address latch circuit 522, an AND circuit 544 receiving a bank select signal YBANK<n> and a signal XBLATR output from address latch circuit 522, an NOR circuit 546 receiving a signal output from AND circuit 542 and that output from AND circuit 544, an inverter 548 receiving and inverting a signal output from NOR circuit 546, an NAND circuit 556 receiving a column select signal CSLR<i:0> for read operation and a signal output from inverter 548, an inverter 558 receiving and inverting a signal output from NAND circuit 556, and an inverter 560 receiving and inverting a signal output from inverter 558 and outputting a signal CSLRD<i:0> driving a column select line.

Row decode circuit 520 also includes an NAND circuit 550 receiving a column select signal CSLW<i:0> for write operation and a signal output form inverter 548, an inverter 552 receiving and inverting a signal output form NAND circuit 550, and an inverter 554 receiving and inverting a signal output form inverter 552 and outputting a signal CSLWD<i:0> driving a column select line.

FIG. 16 is a circuit diagram showing a configuration of the FIG. 13 sense amplifier control circuit 528.

As shown in FIG. 16, sense amplifier control circuit 528 includes a level conversion circuit 572 receiving and inverting signal XBLATL for level conversion, a buffer circuit 574 receiving a signal output from level conversion circuit 572 and outputting a bit line equalization signal BLEQR#3, a level conversion circuit 576 receiving and converting signal XBLATL in level, and a buffer circuit 578 receiving a signal output from level conversion circuit 576 and outputting a bit line isolation signal BLIL#3. Although not shown, bit line equalization signal BLEQE#3 and bit line isolation signal BLIL#3 are transmitted to sense amplifier band SAB#3 arranged between memory cell arrays MA#2 and MA#3.

Sense amplifier control circuit 528 also includes a level conversion circuit 596 receiving and inverting signal XBLATL for level conversion, a buffer circuit 598 receiving a signal output from level conversion circuit 596 and outputting a bit line equalization signal BLEQL#2, a level conversion circuit 600 receiving and converting signal XBLATL in level, and a buffer circuit 602 receiving a signal output from level conversion circuit 600 and outputting a bit line isolation signal BLIR#2.

Sense amplifier control circuit 528 also includes an NOR circuit 580 receiving signals XBLATR and XBLATL, an inverter 582 receiving and inverting a signal output from NOR circuit 580, an NAND circuit 584 receiving a signal output from inverter 582 and a signal XSE indicative of a timing at which a sense amplifier is activated, an inverter 586 receiving and inverting a signal output from NAND circuit 584, a level conversion circuit 588 converting in level a signal output from inverter 586, a buffer circuit 590 receiving a signal output from level conversion circuit 588 and outputting a sense amplifier activation signal SE#2, a level conversion circuit 592 receiving and converting in level a signal output from NAND circuit 584, and a buffer circuit 594 receiving a signal output from level conversion circuit 592 and outputting a sense amplifier activation signal /SE#2.

Although not shown, bit line equalization signal BLEQR#2, bit line isolation signal BLIL#2 and sense amplifier activation signals SE#2 and /SE#2 are transmitted to sense amplifier band SAB#2 arranged between memory cell arrays MA#1 and MA#2.

Conventionally, such a DRAM core as described above has a memory capacity changed by increasing/decreasing the number of memory cell arrays MA#n, wherein n represents a natural number.

Referring again to FIG. 13, conventionally a circuit responsible for selecting a column is arranged in center cross circuit band CCCB#2 and that responsible for selecting a row is arranged in center circuit bands CCB#1, CCB#2. Thus, sense amplifier band SAB#2 receives bit line equalization signal BLEQR#2, bit line isolation signal BLIL#2 and sense amplifier activation signals SE, /SE from sense amplifier control circuit 528 arranged in center circuit band CCB#2. Furthermore, bit line equalization signal BLEQL#2 and bit line isolation signal BLIR#2 are output from sense amplifier control circuit 518 arranged in center circuit band CCB#1, and input to sense amplifier band SAB#2.

As such, as shown in FIG. 12, center cross circuit band CCCB#2 is heavily populated with signal lines. Since center circuit band CCB#2 and center cross circuit band CCCB#2 communicate a large number of signals therebetween, changing the number of memory cell arrays requires an effort in modifying the layout data indicative of an arrangement of circuits, interconnections and the like in designing the same, to change the memory capacity of interest.

SUMMARY OF THE INVENTION

The present invention contemplates a semiconductor memory device allowing the number of memory cell arrays to be readily changed.

The present invention provides a semiconductor memory device including first to sixth regions arranged on the main surface in a matrix of three rows and two columns, each region formed in a quadrangle. The first to third regions are arranged in a first column. The fourth to sixth regions are arranged in a second column adjacent to the first to third regions, respectively. The first and third regions respectively include first and second memory cell arrays each formed in a quadrangle and having therein a plurality of memory cells arranged in rows and columns. The second region includes a first sense amplifier band arranged between and shared by the first and second memory cell arrays, provided in a rectangle having first and second longer sides in contact with the first and second memory cells, respectively. The fourth and sixth regions include first and second row decoders provided for the first and second memory cell arrays, respectively, to select a row of memory cells. The fifth region includes a first column decoder selecting a column of the first and second memory cell arrays and a first sense amplifier control circuit outputting a control signal to the first sense amplifier band.

As such, a main advantage of the present invention is that there can be provided a semiconductor memory device capable of alleviating heavy population of control signal lines and having a memory capacity variable with a simple connection-switching.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
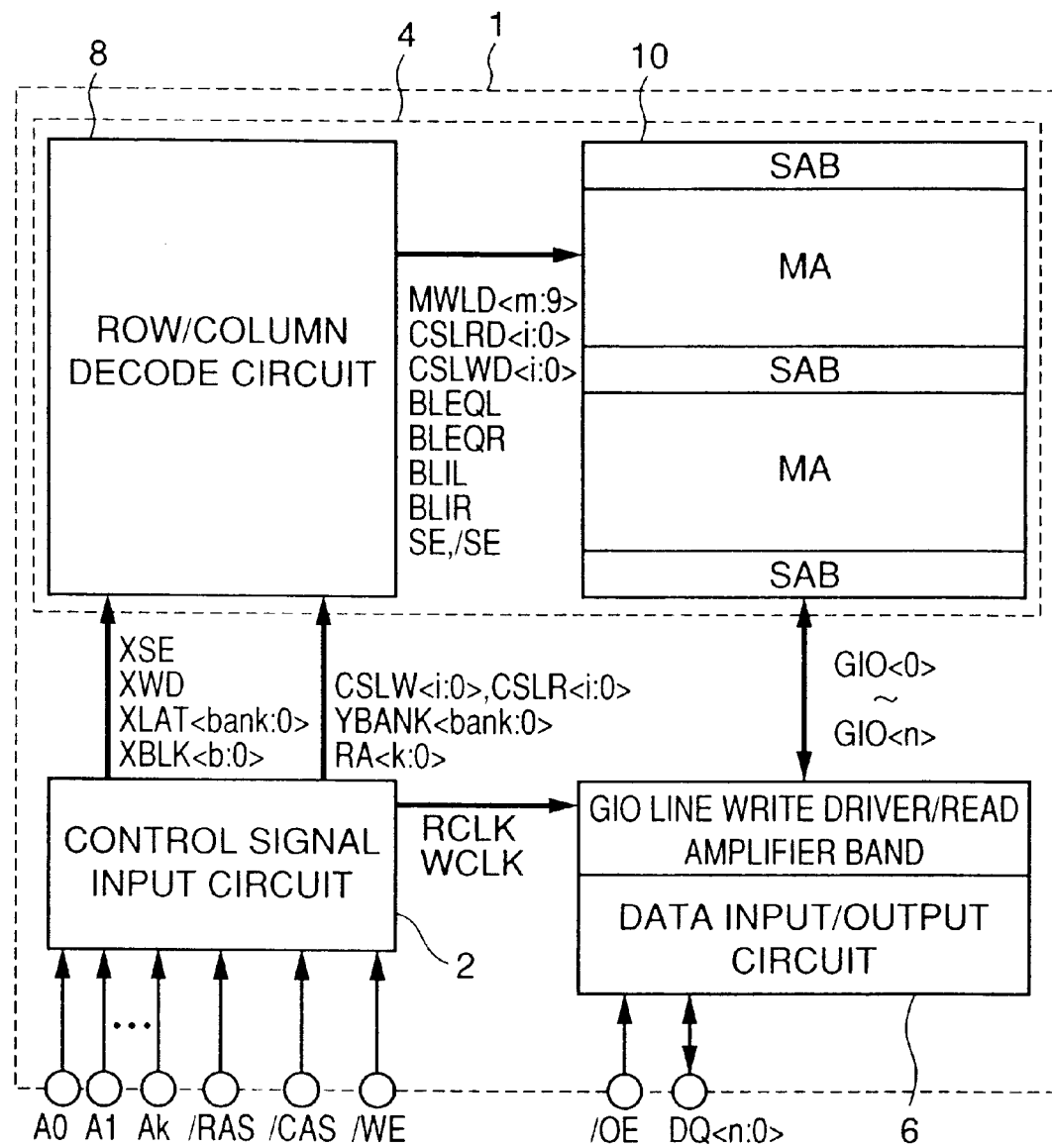
FIG. 1 is a schematic block diagram showing a configuration of a semiconductor memory device 1 in a first embodiment of the present invention.

Hereinafter the embodiments of the present invention will be described with reference to the drawings in detail. Note that in the figures like reference characters denote like portions.

First Embodiment

FIG. 1 is a block diagram schematically showing a configuration of a semiconductor memory device 1 in a first embodiment of the present invention.

As shown in FIG. 1, semiconductor memory device 1 includes a control signal input/output circuit 2 responding to address signals A0–An and command signals /RAS, /CAS and /WE by generating various control signals and a clock signal, a DRAM array circuit 4 responding to a control signal received from control signal input/output circuit 2 by communicating data, and a data input/output circuit 6 responding to a read clock signal RCLK and a write clock signal WCLK by inputting/outputting data to/from the DRAM array circuit.

The control signal input/output circuit outputs signals XSE, XWD, XLAT<bank:0>, XBLK<b:0> to DRAM array circuit 4. Signal XSE is generated responsively when a row active command ACT and a precharge command PRE are input, and it indicates a timing at which activating and inactivating a sense amplifier is controlled. In response to signal XSE, sense amplifier activation signals SE, /SE are eventually produced.

Signal XWD is generated responsively when the ACT and PRE commands are input. Signal XWD indicates a timing at which activating and inactivating a word line WL is controlled. Signal XBLK is produced from a row address signal RA<k:0> and it is a block select signal. Signal XLAT<bank:0> is a signal latching signals RA and XBLK in a bank circuit selected. For each bank there exists signal XLAT and only in a selected bank signals RA and XBLK are latched.

Control signal input/output circuit 2 also outputs signals CSLW<i:0>, CSLR<i:0>, YBANK<bank:0>, RA<k:0> to DRAM array circuit 4. Signal CSLW is a column select signal for write operation and signal CSLR is that for read operation. Signal YBANK is a bank select signal selected by a column address.

Although not shown, the control signal input/output circuit includes an address buffer receiving address signals A0–An, a command decode circuit receiving command signals /RAS, /CAS, /WE and referring to a combination of the command signals to provide a decoding operation to recognize commands such as ACT, PRE and the like, and a clock generation circuit generating read clock signal RCLK and write clock signal WCLK. The clock generation circuit outputs read and write clock signals RCLK and WCLK to data input/output circuit 6.

DRAM array circuit 4 includes a row/column decode circuit 8 responding to a signal output from control signal input/output circuit 2 by decoding a row address and decoding a column address and controlling a sense amplifier, and a memory block 10 responding to a signal output from row/column decode circuit 8 by communicating data with data input/output circuit 6 via global input/output lines GIO<0>–GIO<n>. Memory block 10 is divided into memory cell array MA and sense amplifier band SAB.

Data input/output circuit 6 includes a read amplifier band amplifying data read on global 10 line GIO and a GIO line write driver outputting to a global IO line the data to be written to a memory cell array.

Herein, semiconductor memory device 1 represents not only a single semiconductor memory device but a DRAM core used mounted together with a logic circuit in a mixed manner. A DRAM core is characterized in that it has a data input/output signal DQ<n:0> bus wider in width than conventional semiconductor memory devices. More specifically, it has several hundreds of data input/output nodes to allow a connected logic circuit and the DRAM core to transfer data therebetween more rapidly.

Figure 2:
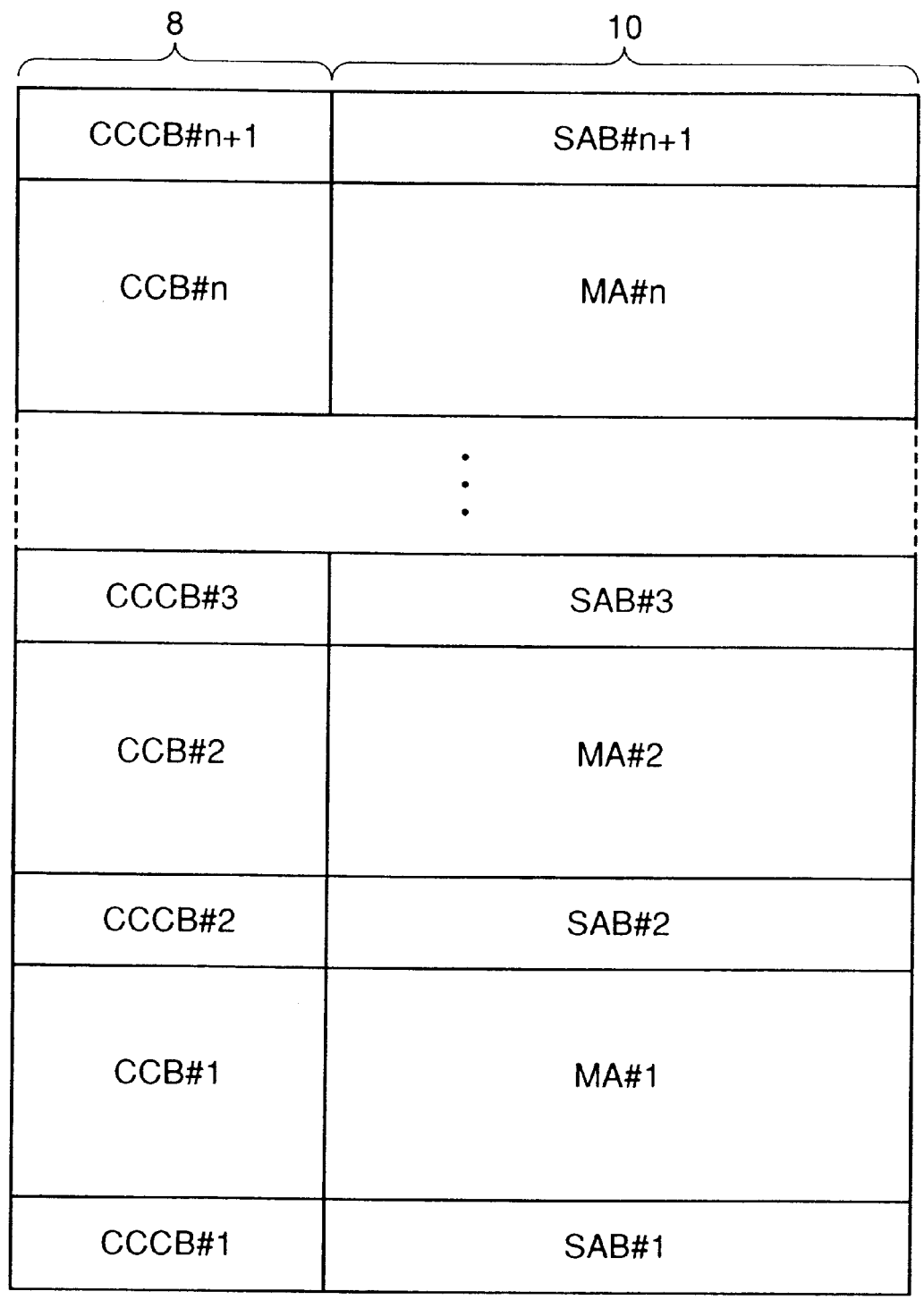
FIG. 2 shows an arrangement of the FIG. 1 DRAM array circuit 4.

FIG. 2 shows an arrangement of the FIG. 1 DRAM array circuit 4.

As shown in FIG. 2, row/column decode circuit 8 is arranged adjacent to memory block 10.

Memory block 10 includes memory cell arrays MA#1–MA#n and sense amplifier bands SAB#1–SAB#n+1. Between memory cell arrays MA#1 and MA#2 there is sense amplifier band SAB#2 shared by two memory arrays. Similarly, any sense amplifier band posed between memory arrays is shared by two adjacent memory arrays. In other words, memory block 10 has a so-called shared sense amplifier configuration.

Adjacent to memory cell arrays MA#1, MA#2, A, MA#n, row/column decode circuit 8 has rectangular regions, respectively, which will be referred to as center circuit bands CCB#1, CCB#2, A, CCB#n, respectively. Similarly, adjacent to sense amplifier bands SAB#1, SAB#2, SAB#3, A, SAB#n+1, row/column decode circuit 8 has rectangular regions, respectively, which will be referred to as center cross circuit bands CCCB#1, CCCB#2, CCCB#3, A, CCCB#n+1, respectively.

That is, row/column decode circuit 8 is divided into center circuit bands and center cross circuit bands.

Figure 3:
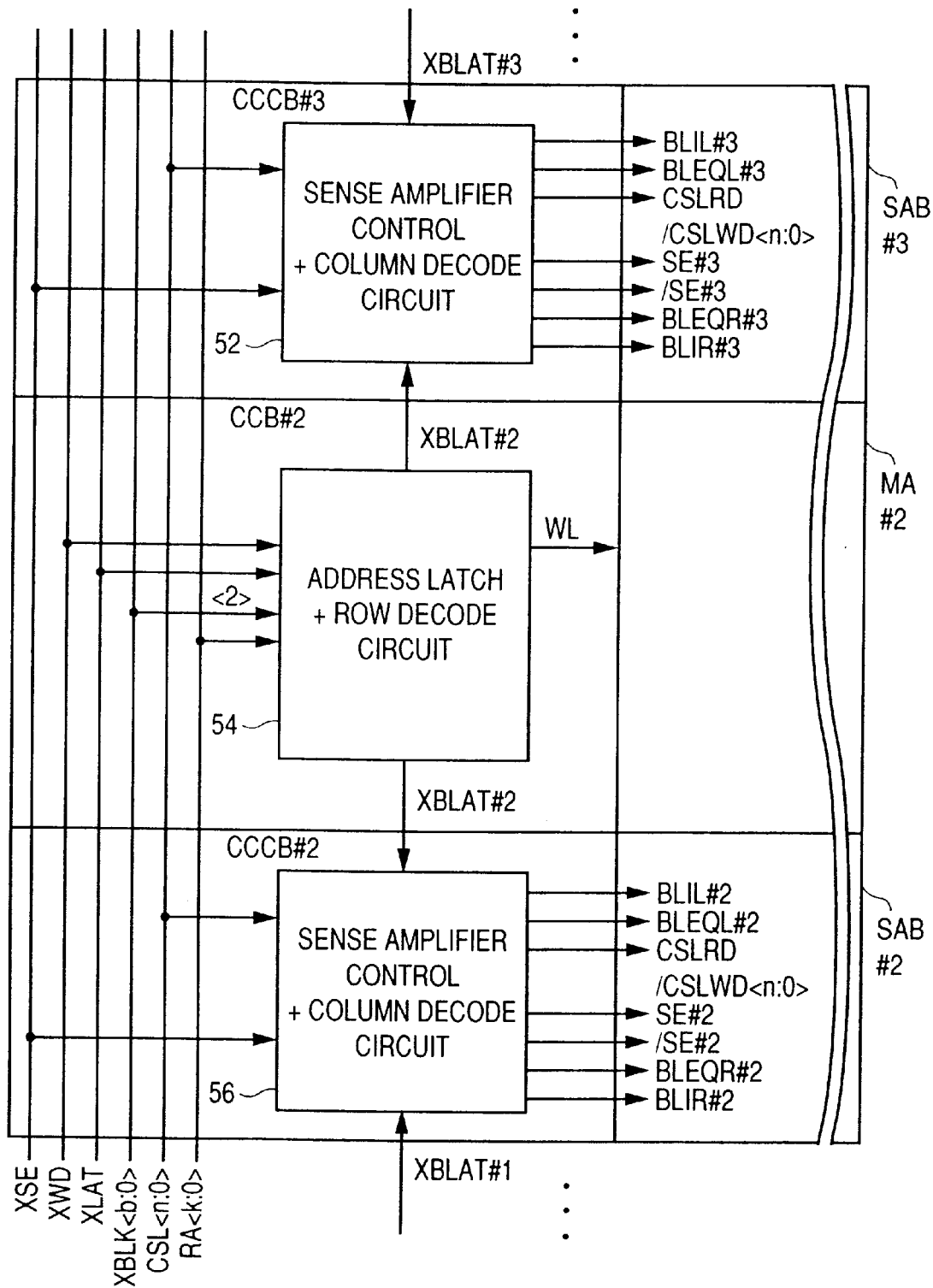
FIG. 3 is a block diagram for illustrating a circuit included in a center cross circuit band and that included in a center circuit band.

FIG. 3 is a block diagram for illustrating a circuit included in the center cross circuit band and that included in the center circuit band.

With reference to FIG. 3, center cross circuit band CCCB#2 is provided with a sense amplifier control and column decode circuit 56, which responds to signals XSE, CSL<n:0>, XBLAT#1, ZBLAT#2 by outputting bit line isolation signal BLIL#2, bit line equalization signal BLEQL#2, column select signals CSLRD<n:0> and CSLWD<n:0>, sense amplifier activation signals SE#2, /SE#2, bit line equalization signal BLEQR#2, bit line isolation signal BLIR#2. These signals are applied to sense amplifier band SAB#2.

In center circuit band CCB#2 is arranged an address latch and row decode circuit 54, which responds to signals XWD, XLAT, XBLK<2>, RA<k:0> by outputting signal XBLAT#2 to center cross circuit bands CCCB#2, CCCB#3 and also activates any one of the word lines arranged in memory cell array MA#1.

In center cross circuit band CCCB#3 is arranged a sense amplifier control and column decode circuit 52, which responds to signals XSE, CSL<n:0>, XBLAT#2, XBLAT#3 by outputting bit line isolation signal BLIL#3, bit line equalization signal BLEQL#3, column select signals CSLRD<n:0>, CSLWD<n:0>, sense amplifier activation signals SE#3, /SE#3, bit line equalization signal BLEQR#3 and bit line isolation signal BLIR#3. These signals are applied to sense amplifier band SAB#3.

Figure 4:
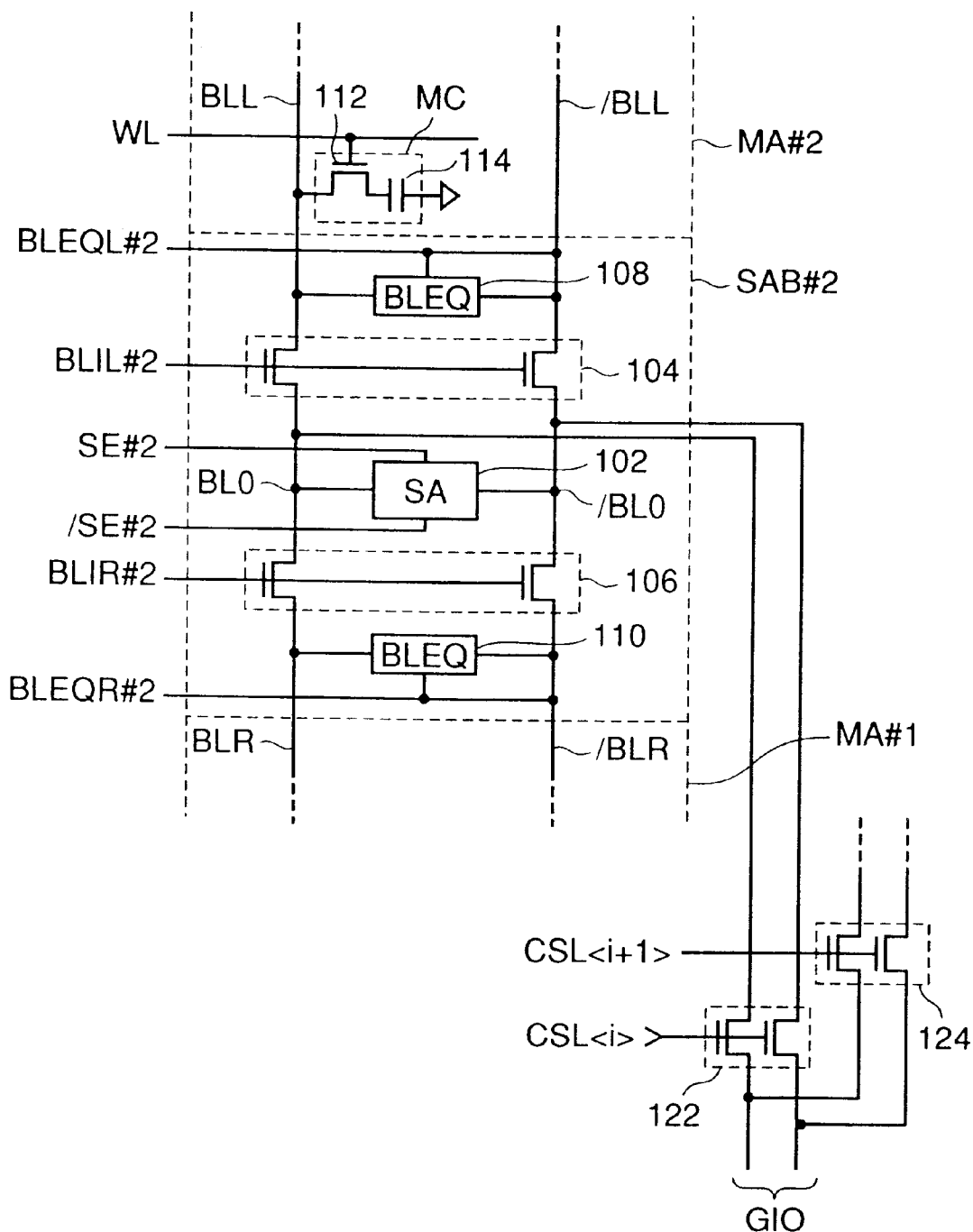
FIG. 4 is a circuit diagram for illustrating a configuration of the FIG. 3 sense amplifier band SAB#2.

FIG. 4 is a circuit diagram for illustrating a configuration of the FIG. 3 sense amplifier band SAB#2.

As shown in FIG. 4, sense amplifier band SAB#2 includes a sense amplifier 102 responding to sense amplifier activation signals SE#2, /SE#2 by increasing a potential difference between bit lines BL0 and /BL0, a bit line isolation gate 104 isolating bit lines BL0 and /BL0 and bit lines BLL and /BLL, respectively, and an equalizer circuit 108 responding to equalization signal BLEQL#2 by equalizing a potential of bit line BLL and a potential of bit line /BLL. Bit line isolation gate 104 is configured of two n-channel MOS transistors turning on for bit line isolation signal BLIL#2 of logical high and turning off for bit line isolation signal BLIL#2 of logical low.

Sense amplifier band SAB#2 also includes a bit line isolation gate 106 isolating bit lines BL0 and /BL0 and bit lines BLR and /BLR, respectively, and an equalizer circuit 110 responding to bit line equalization signal BLEQR#2 by equalizing a potential of bit line BLR and a potential of bit line /BLR.

Bit line isolation gate 106 is configured of two n-channel MOS transistors turning on for bit line isolation signal BLIR#2 of logical high and turning off for bit line isolation signal BLIR#2 of logical low.

Bit lines BLL and /BLL are bit lines provided for memory cell array MA#2. At an intersection of bit line BLL and word line WL is provided memory cell MC including an access transistor 112 turning on responsively when a word line is activated, and a capacitor 114 having one end connected to bit line BLL via the access transistor and the other end coupled with a cell plate potential. Note that in the figure a single memory cell MC is shown representatively.

Bit lines BLR, /BLR are bit lines provided for memory cell array MA#1 and similarly having memory cells connected thereto. A description thereof will not be repeated.

Furthermore, corresponding to sense amplifier band SAB#2 there is provided a column select gate 122 turning on in response to a column select signal CSL<i> generated according to a column address. Thus in a read or a write bit lines BL0, /BL0 are connected to a global IO line. Note that a column select gate is provided for a column and for example for an adjacent bit line pair is provided a column select gate 124.

In FIG. 4, a sense amplifier band has been described in configuration representatively by referring to a portion corresponding to one column of memory cells. Note that if in a read an IO line is used to transmit data and in a write another IO line is used to transmit data, a column select gate is provided which responds to read and write column select signals CSLR and CSLW by connecting bit lines to different IO lines, respectively.

Figure 5:
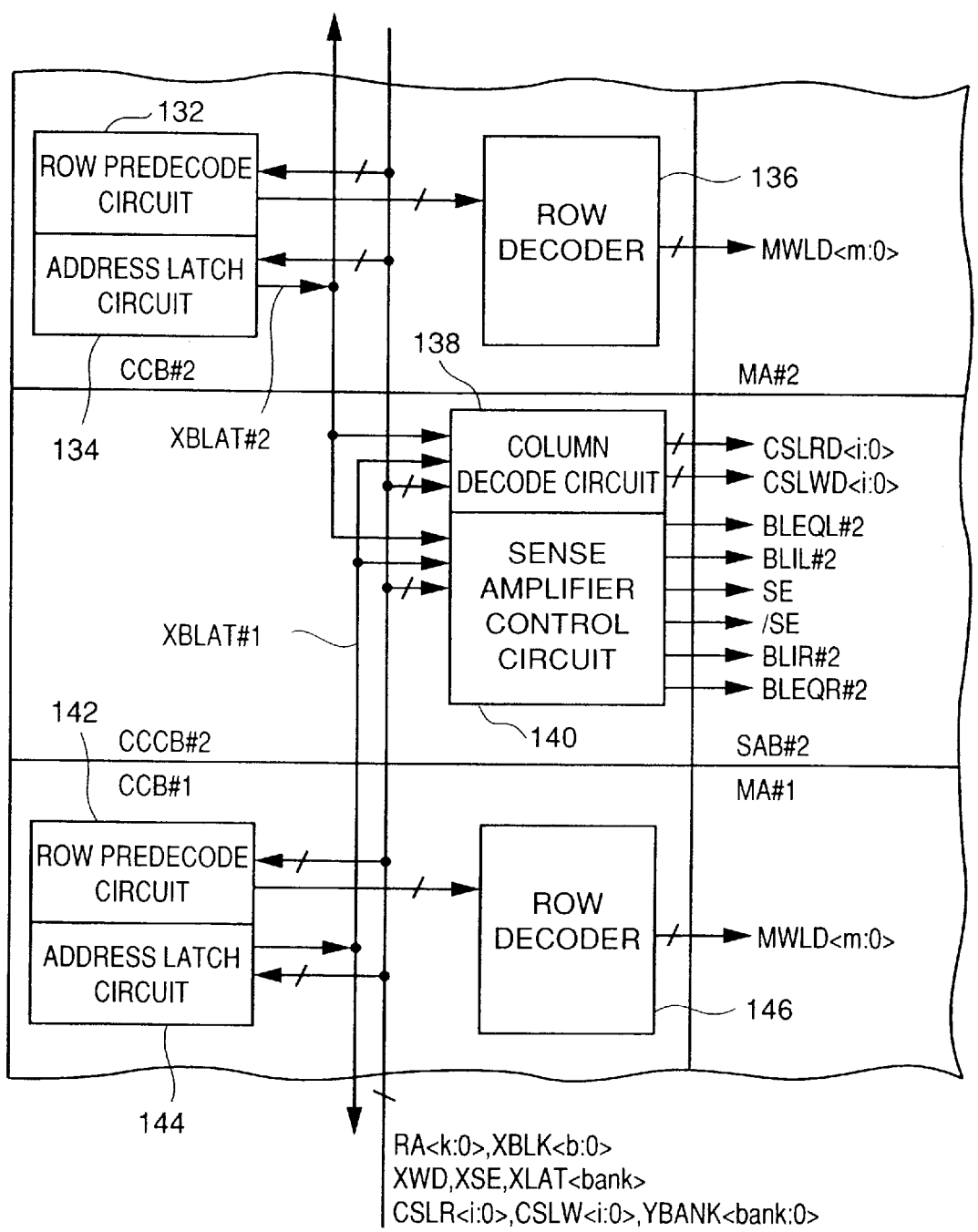
FIG. 5 is a block diagram for illustrating signals input to sense amplifier band SAB#2.

FIG. 5 is a block diagram for illustrating a signal input to sense amplifier band SAB#2.

As shown in FIG. 5, center circuit band CCB#1 is provided with a row predecode circuit 142, an address latch circuit 144 and a row decoder 146.

Center circuit CCB#2 is provided with a row predecode circuit 132, an address latch circuit 134 and a row decoder 136. Row predecode circuit 132, address latch circuit 134 and row decoder 136 corresponds to the FIG. 3 address latch and row decode circuit 54.

In center cross circuit band CCCB#2 are provided a column decode circuit 138 and a sense amplifier control circuit 140, which are correspond to the FIG. 3 sense amplifier control and column decode circuit 56.

Figure 6:
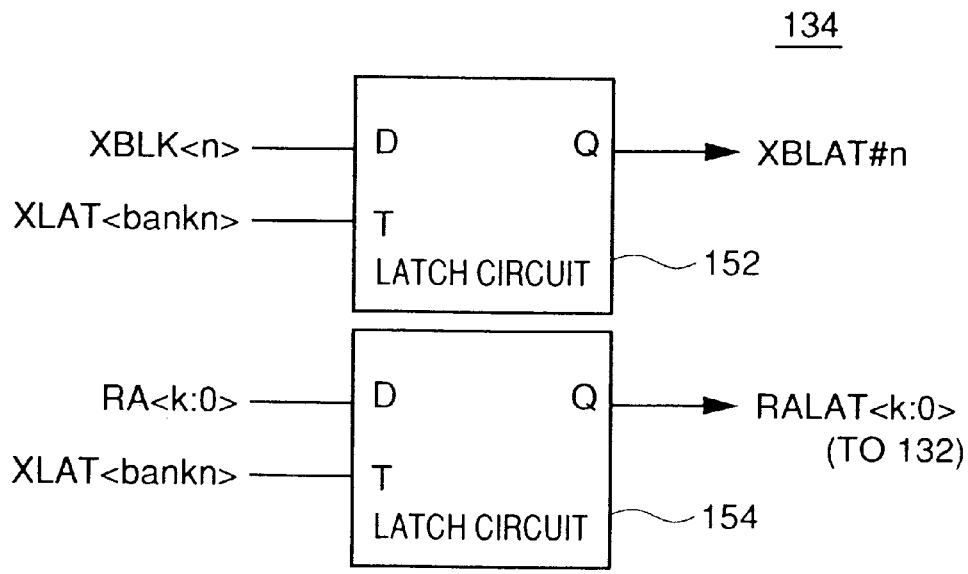
FIG. 6 is a circuit diagram showing a configuration of the FIG. 5 address latch circuit 134.

FIG. 6 is a circuit diagram showing a configuration of the FIG. 5 address latch circuit 134. As shown in FIG. 6, address latch circuit 134 includes a latch circuit 152 latching signal XBLK<n> in synchronization with signal XLAT<bankn>, and a latch circuit 154 latching row address signal RA<k:0> in synchronization with signal XLAT<bankn>. Latch circuit 152 outputs a signal XBLAT#n indicating that memory cell array #n has been selected. Latch circuit 154 outputs row address signal RALAT<k:0> having been input in response to a memory block having been selected. Row address signal RALAT<k:0> is input to and predecoded in the FIG. 5 row predecode circuit 132.

The predecoded signal is fed to row decoder 136 to activate any one of signal MWLD<m:0> for driving a word line. Note that signal XBLK<n>corresponds to signal XBLK<2>.

Figure 7:
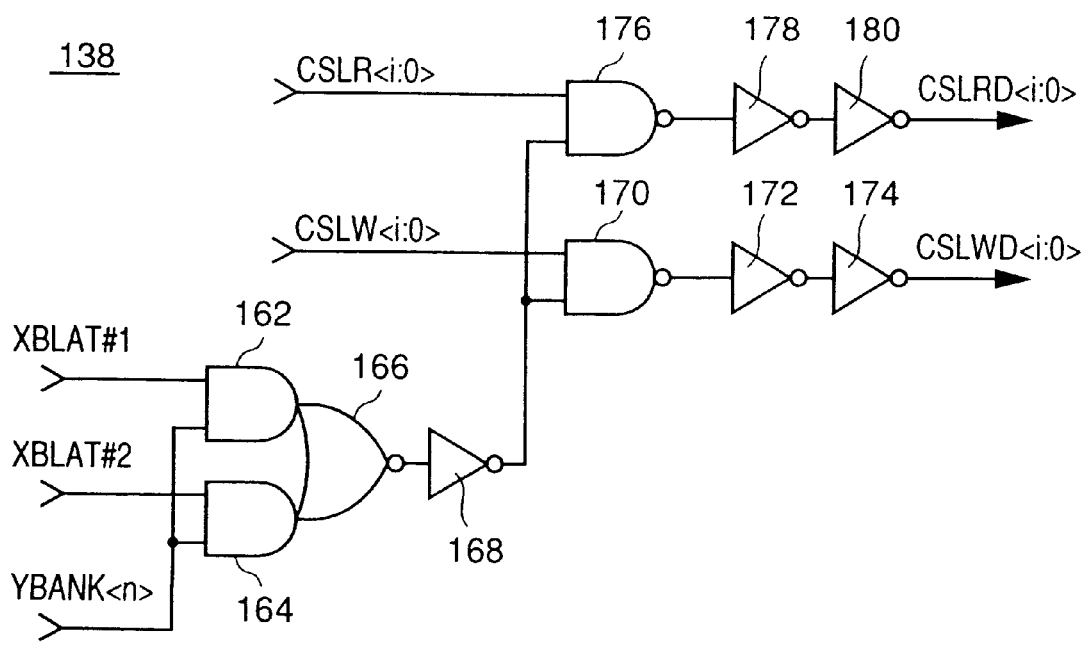
FIG. 7 is a circuit diagram showing a configuration of the FIG. 5 column decode circuit 138.

The FIG. 5 address latch circuit 144 is similar in configuration to the FIG. 7 address latch circuit 134 and a description thereof will thus not be repeated, although for address latch circuit 144, signal XBLK<n>corresponds to signal XBLK<1>.

FIG. 7 is a circuit diagram showing a configuration of the FIG. 5 column decode circuit 138.

As shown in FIG. 7, column decode circuit 138 includes an AND circuit 162 receiving bank select signal YBANK<n> and signal XBLAT#1 output from address latch circuit 144, an AND circuit 164 receiving bank select signal YBANK<n> and signal XBLAT#2 output from address latch circuit 134, an NOR circuit 166 receiving signals output from AND circuits 162 and 164, an inverter 168 receiving and inverting a signal output from NOR circuit 166, an NAND circuit 176 receiving column select signal CSLR<i:0> for read operation and a signal output from inverter 168, an inverter 178 receiving and inverting a signal output from NAND circuit 176, and an inverter 180 receiving and inverting a signal output from inverter 178 and outputting a signal CSLRD<i:0> driving a column select line.

Column decode circuit 138 also includes an NAND circuit 170 receiving column select signal CSLW<i:0> for write operation and a signal output from inverter 168, an inverter 172 receiving and inverting a signal output from NAND circuit 170, and an inverter 174 receiving and inverting a signal output from inverter 172 and outputting a signal CSLWD<i:0>driving a column select line.

Figure 8:
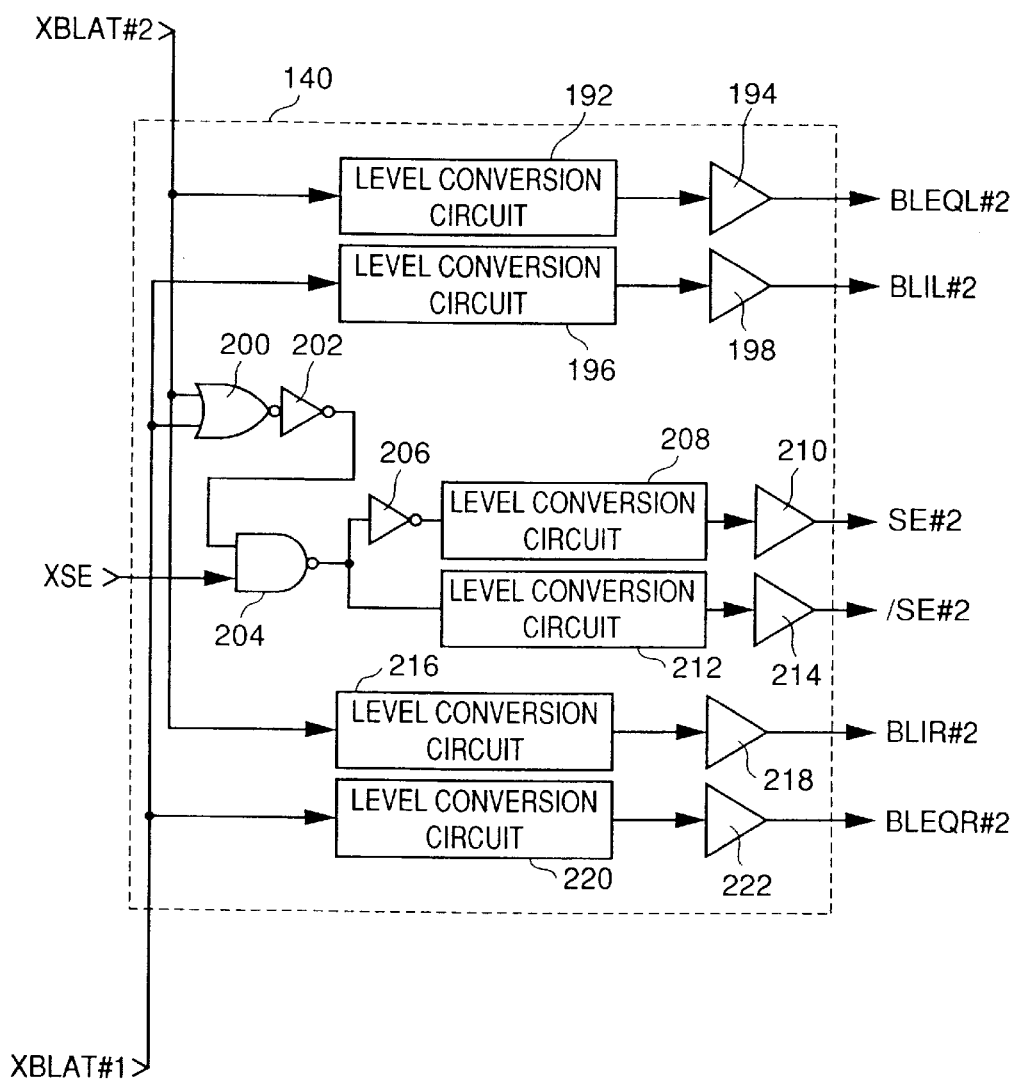
FIG. 8 is a circuit diagram showing a configuration of the FIG. 5 sense amplifier control circuit 140.

FIG. 8 is a circuit diagram showing a configuration of the FIG. 5 sense amplifier control circuit 140.

As shown in FIG. 8, sense amplifier control circuit 140 includes a level conversion circuit 192 receiving and converting signal XBLAT#2 in level, a buffer circuit 194 receiving a signal output from level conversion circuit 192 and outputting bit line equalization signal ZLEQL#2, a level conversion circuit 196 receiving and converting signal XBLAT#1 in level, a buffer circuit 198 receiving a signal output from level conversion circuit 196 and outputting bit line isolation signal BLIL#2, a level conversion circuit 216 receiving and converting signal XBLAT#2 in level, a buffer circuit 218 receiving a signal output from level conversion circuit 216 and outputting bit line isolation signal BLIR#2, a level conversion circuit 220 receiving and converting signal XBLAT#1 in level, and a buffer circuit 222 receiving a signal output from level conversion circuit 220 and outputting bit line equalization signal BLEQR#2.

Sense amplifier control circuit 140 also includes an NOR circuit 220 receiving signals XBLAT#1, XBLAT#2, an inverter 202 receiving and inverting a signal output from NOR circuit 200, an NAND circuit 204 receiving a signal output from inverter 202 and signal XSE indicating a timing at which a sense amplifier is activated, an inverter 206 receiving and inverting a signal output from NAND circuit 204, a level conversion circuit 208 converting in level a signal output from inverter 206, a buffer circuit 210 receiving a signal output from level conversion circuit 208 and outputting sense amplifier activation signal SE#2, a level conversion circuit 212 receiving a signal output from NAND circuit 204 for level conversion, and a buffer circuit 214 receiving a signal output from level conversion circuit 212 and outputting sense amplifier activation signal /SE#2.

A sense amplifier band uses a large number of transmission gate circuits configured of an n-channel MOS transistor. To prevent voltage from dropping by a threshold voltage, the sense amplifier band receives a control signal having a logical high level converted in level by a level conversion circuit, as has been described above. For example, a control circuit has a logical high level converted in level from an internal power supply potential Vdd to a boosted potential Vpp.

Referring again to FIG. 3 the present embodiment operates as will be described hereinafter.

Figure 12:
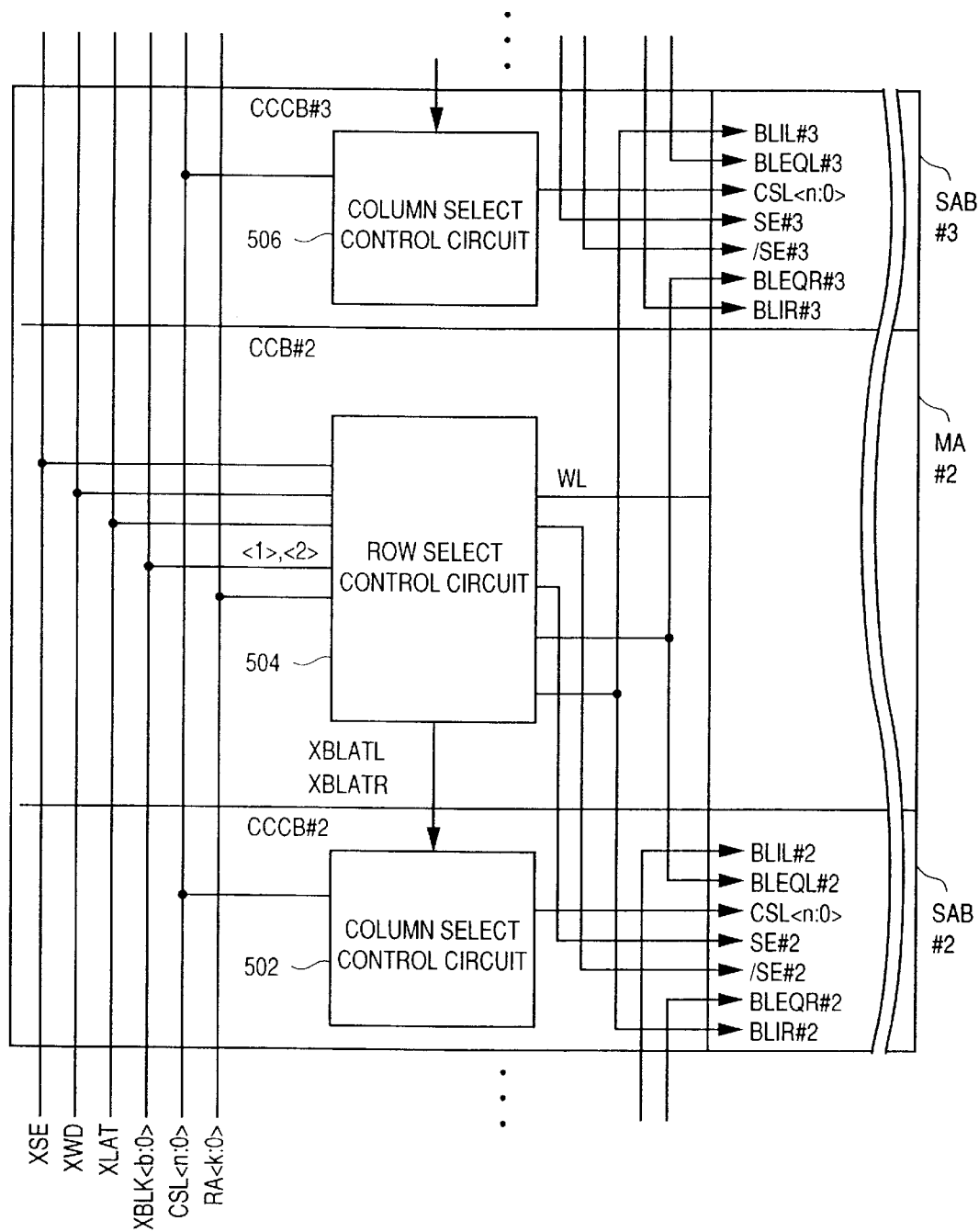
FIG. 12 illustrates an arrangement of a circuit block having arranged therein a conventional DRAM core's memory cell array and sense amplifier.
Figure 13:
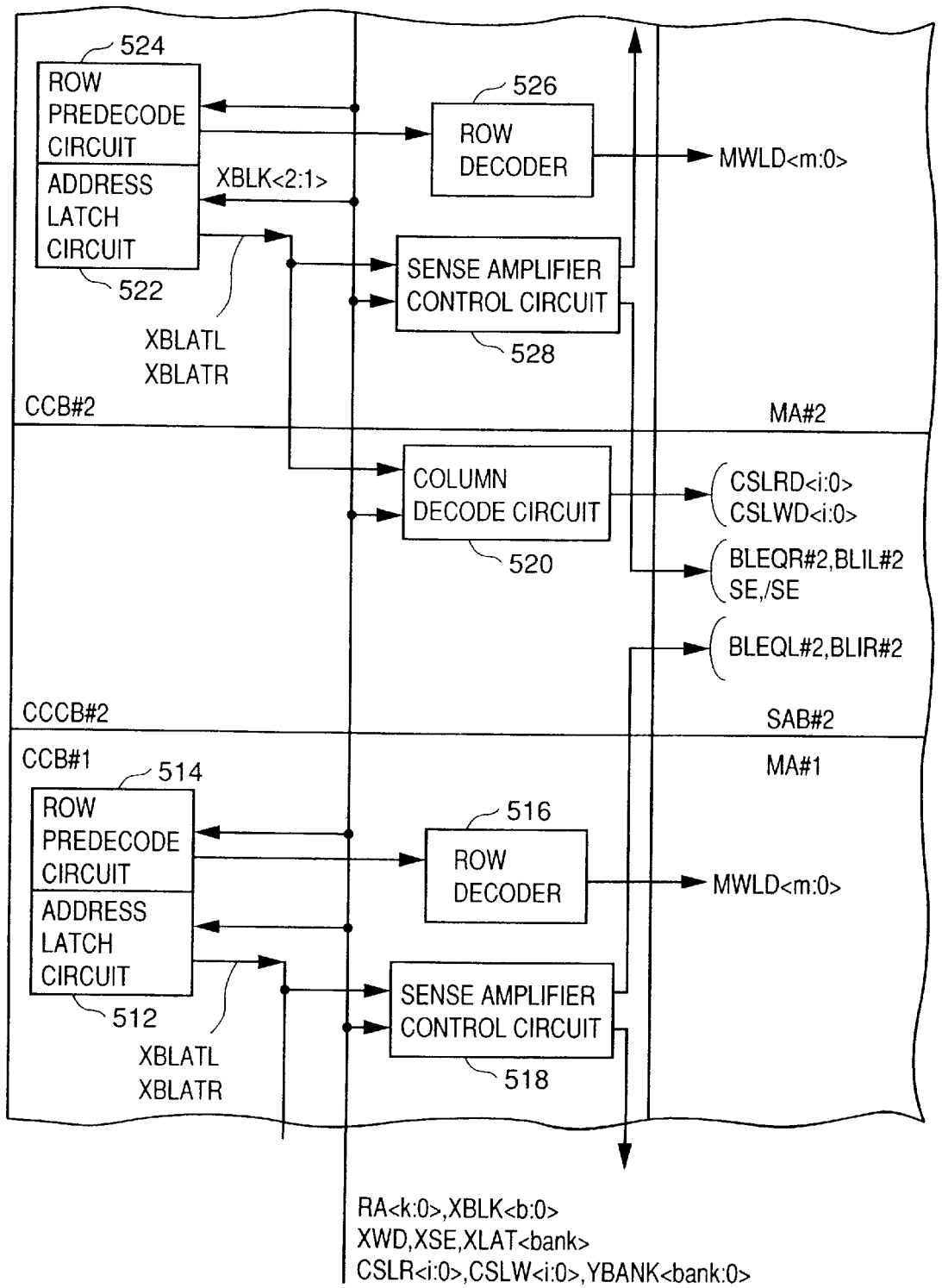
FIG. 13 is a block diagram for illustrating signals input to the FIG. 12 center cross circuit band CCCB#2.
Figure 14:
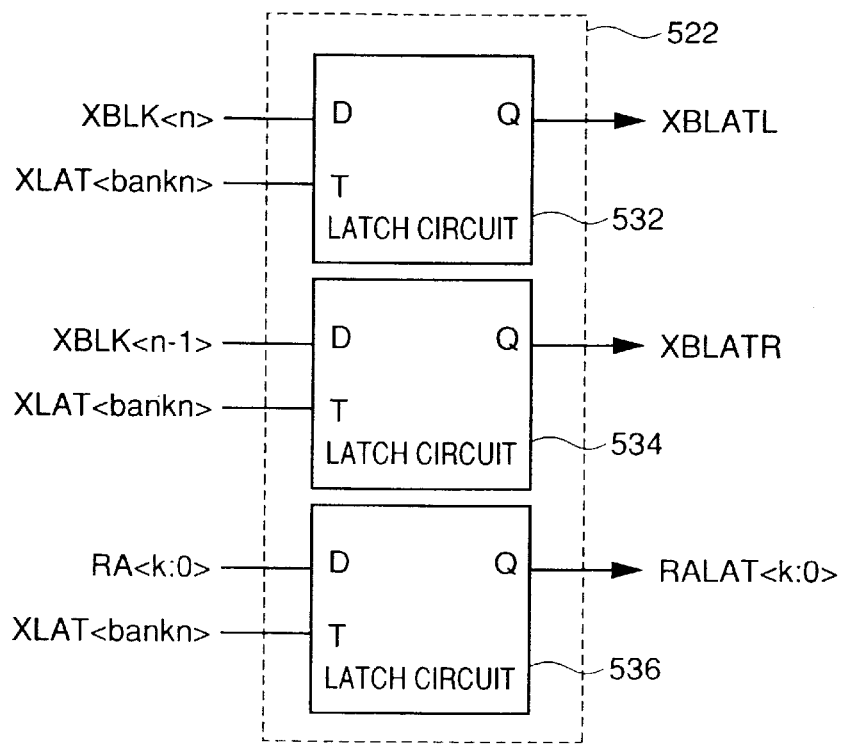
FIG. 14 is a circuit diagram showing a configuration of the FIG. 13 address latch circuit 522.
Figure 15:
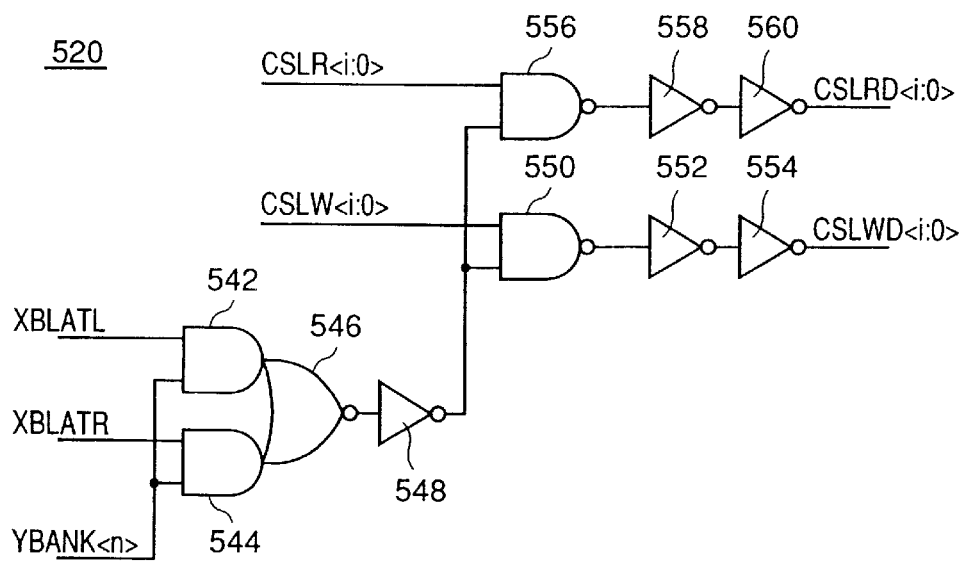
FIG. 15 is a circuit diagram showing a configuration of the FIG. 13 column decode circuit 520.
Figure 16:
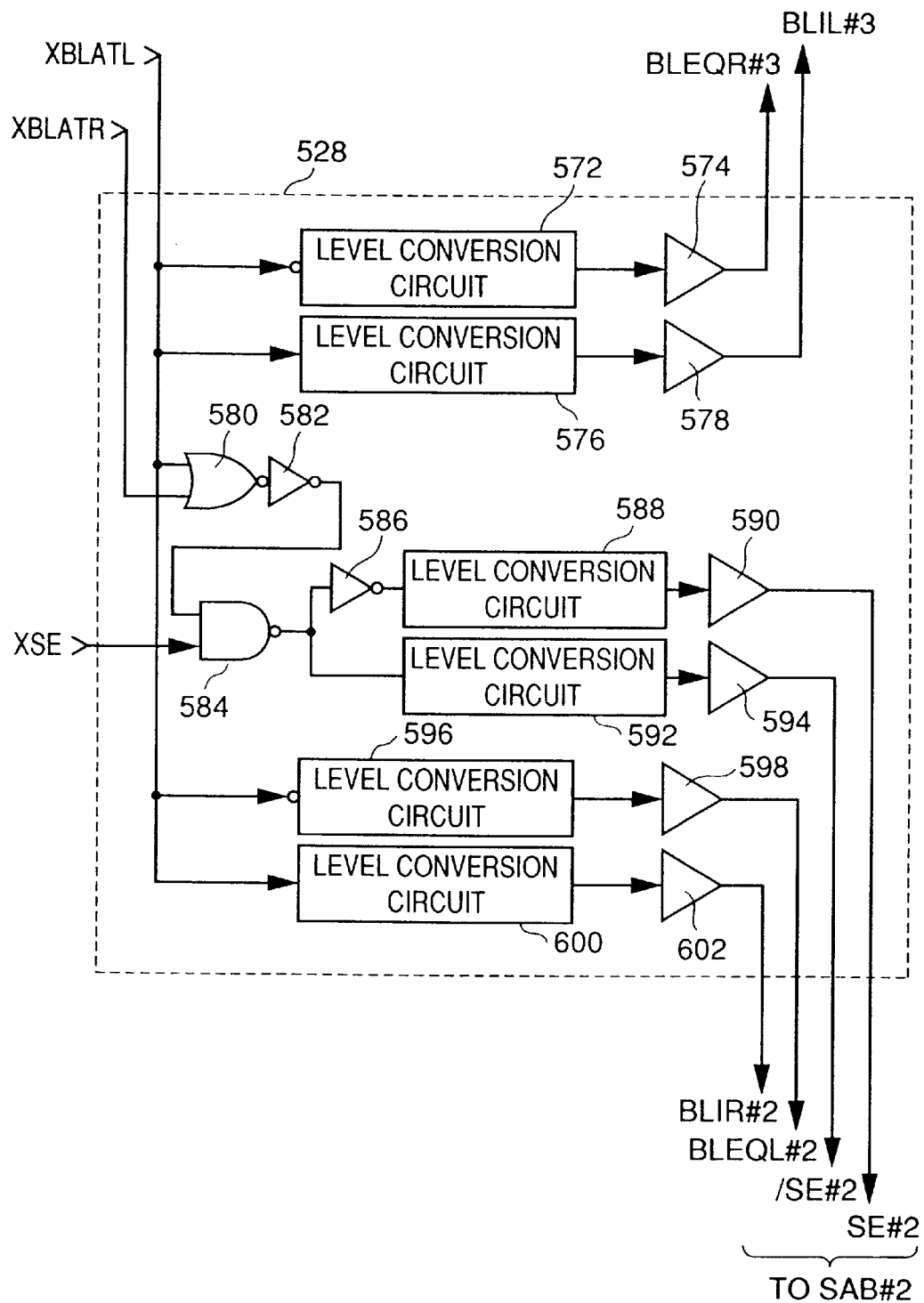
FIG. 16 is a circuit diagram showing a configuration of the FIG. 13 sense amplifier control circuit 528.

In the conventional center circuit band CCB#2, as shown in FIG. 12, circuit 504 is arranged for controlling a row select operation and it outputs a signal activating a sense amplifier and those isolating and equalizing bit lines.

In the first embodiment, as shown in FIG. 3, block select signal XBLK<2> is latched at a predetermined timing and from address latch and row decode circuit 54 to the center cross circuit bands arranged thereabove and therebelow, respectively, the latched signal XBLAT#2 is output. Address latch and row decode circuit 54 latches a block select signal until a precharge operation is performed.

A circuit controlling a sense amplifier is arranged in center cross circuit band CCCB#2, and a bit line isolation signal and a bit line equalization signal and a sense amplifier activation signal are generated internal to center cross circuit band CCCB#2 and transmitted to sense amplifier band SAB#2.

Thus, a center circuit band and a center cross circuit band only communicate a single signal XBLAT#2 therebetween, except for a vertically penetrating, control signal bus. This can prevent the semiconductor memory device from being heavily populated with signal lines, as conventional.

In other words, a circuit generating each control signal with reference to a block select signal can be provided adjacent to a sense amplifier to reduce the number of signal lines.

More specifically, if memory cell array MA#2 is selected, in center circuit band CCB#2 address latch and column decode circuit 54 receives block select signal XBLK<2> activated. The signal is latched by address latch and row decode circuit 54 and transmitted to center cross circuit bands CCCB#2 and CCCB#3. Responsively, sense amplifier control and column decode circuits 56 and 52 operate. For example, bit line isolation signal BLIR#2 is driven low, which isolates from a sense amplifier a bit line provided opposite to memory cell array MA#2 with sense amplifier band SAB#2 posed therebetween.

Then, bit line equalization signal BLEQL#2 is driven low and for memory cell array MA#2 a bit line equalization circuit is inactivated. Subsequently when memory cell array MA#2 has a word line activated a memory cell's data is read on a bit line and in response to sense amplifier activation signals SA#2, /SA#2 the read data is amplified. Sense amplifier activation signals SE, /SE are activated at a timing in response to signal XSE activated after word line WL is activated and data is transferred to a bit line.

A signal amplified by a sense amplifier has data, as required, read on a global IO line in response to a column select signal selected by a column decode circuit provided in sense amplifier control and column decode circuit 56. A similar operation is also provided in center cross circuit band CCCB#3.

As has been described above, the circuit controlling a sense amplifier can operate using latched block select signal XBLAT to reduce complicated interconnections. It can also reduce an interconnection in length. Furthermore, a sense amplifier band and a memory cell array can have a boundary therebetween with a center cross circuit band and a center circuit band communicating a reduced number of signals therebetween. As such, the DRAM's memory capacity can be readily changed.

Furthermore, there can also be provided a DRAM core circuit allowing a change to be introduced in designing its memory capacity with a simple connection-switching and the like.

Second Embodiment

Figure 9:
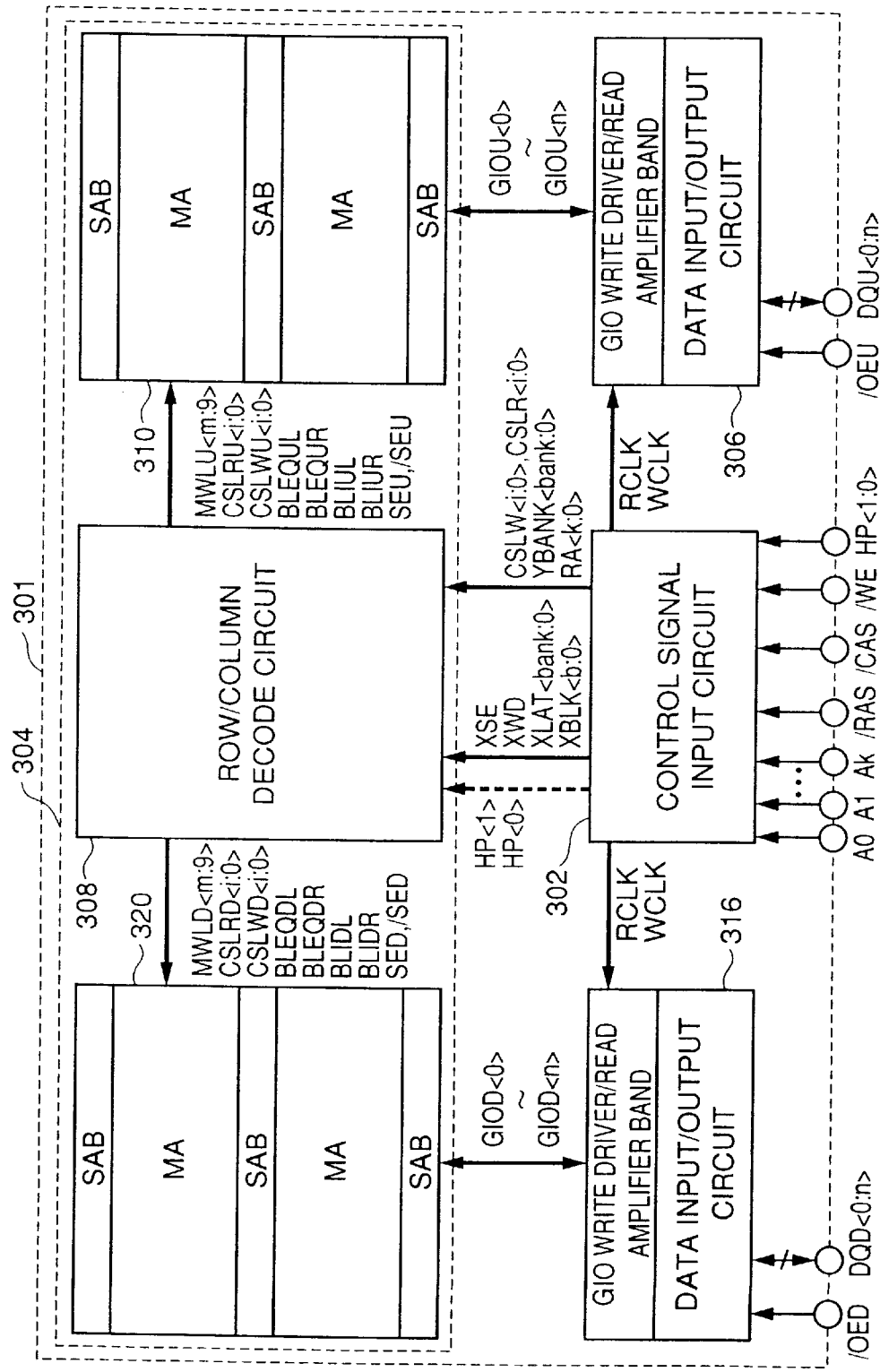
FIG. 9 is a block diagram showing a configuration of a semiconductor memory device 301 in a second embodiment of the present invention.

FIG. 9 is a block diagram showing a configuration of a semiconductor memory device 301 in a second embodiment of the present invention.

As shown in FIG. 9, semiconductor memory device 301 includes a control signal input circuit 302 responding to address signals A0–An, control signals /RAS, /CAS and /WE and a half page signal HP<1:0> by internally feeding clock signals RCLK and WCLK and a plurality of control signals, a DRAM array circuit 304 responding to a control signal received from control signal input circuit 302 by allowing data to be read therefrom and written thereto, and data input/output circuits 306 and 316 allowing data to be communicated between DRAM array circuit 304 and a logic circuit or the like connected to semiconductor memory device 301.

The control signal input circuit includes a clock generation circuit generating read and write clock signals RCLK and WCLK and applying the signals to data input/output circuits 306 and 316, a row/column address buffer latching address signals A0–An as a row address or a column address, and a command decode circuit referring to a combination of control signals /RAS, /CAS and /WE to recognize a command.

DRAM array circuit 304 includes a row/column decode circuit 308 at a center thereof and memory blocks 310 and 320 on opposite sides of row/column decode circuit 308. Memory blocks 310 and 320 are similar in configuration to the FIG. 1 memory block 10 and a description thereof will thus not be repeated.

These two memory blocks are selected in response to a half page signal HP<1:0> input to the control signal input circuit and they thus operate. If memory blocks 310 and 320 are both accessed simultaneously, half page signals HP<1> and HP<0> are both set high. If either one of the memory blocks is selected, half page signal HP<1:0> has one bit set high to select a memory array corresponding thereto. Selecting a memory block to be operated, as appropriate, can reduce an operating current.

Figure 10:
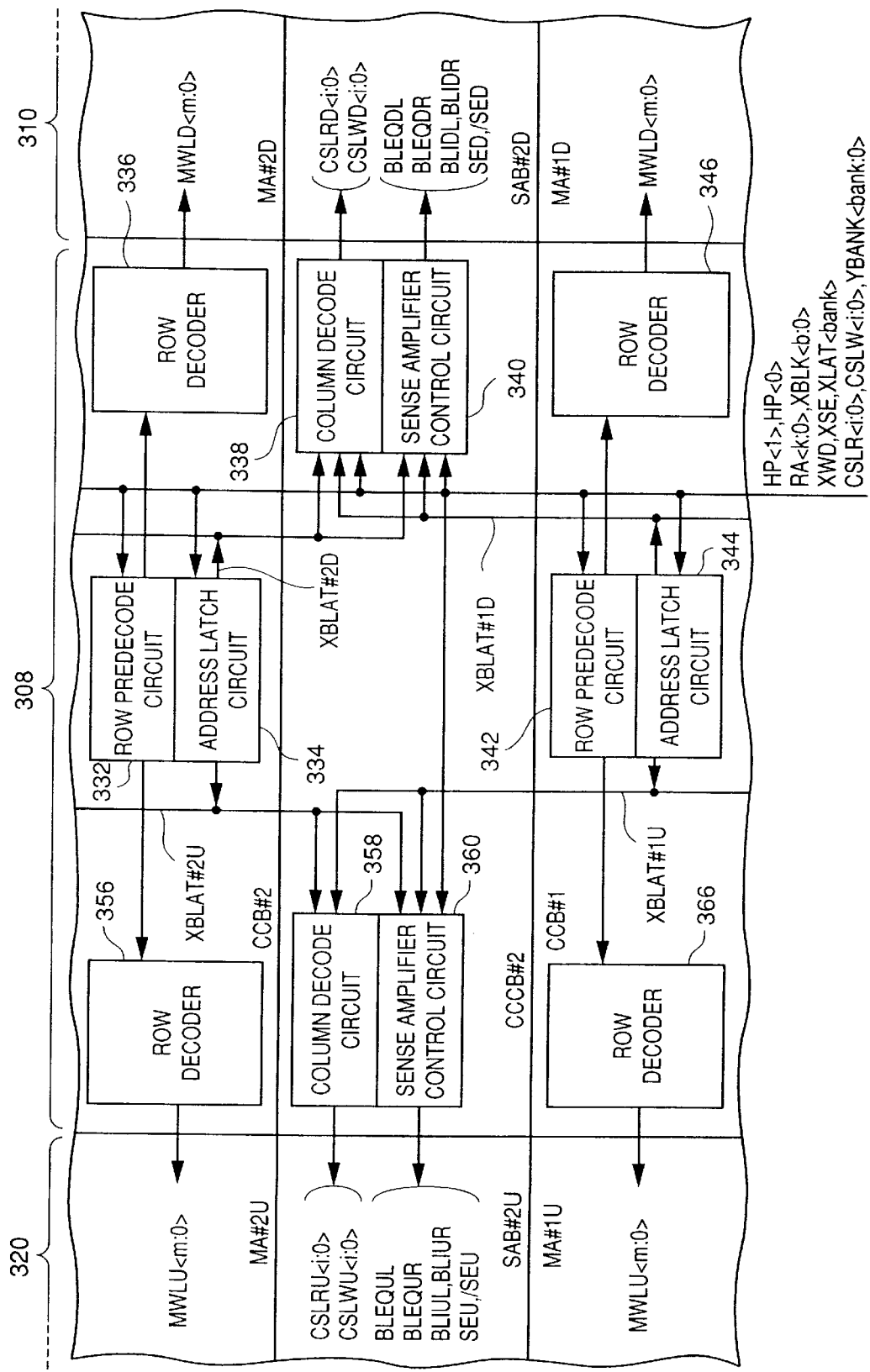
FIG. 10 illustrates signal communication between the FIG. 9 row/column decode circuit 308 and memory blocks 310, 320.

FIG. 10 illustrates signal communications between the FIG. 9 row/column decode circuit 308 and memory blocks 310 and 320.

As shown in FIG. 10, in memory block 310 between memory cell arrays MA#1D and MA#2D is provided a sense amplifier band SAB#2D. As is similar to the FIG. 5 arrangement, adjacent to memory cell array MA#1D, sense amplifier band SAB#2D and memory cell array MA#2D are provided center circuit band CCB#1, center cross circuit band CCCB#2 and center circuit band CCB#2, respectively.

On a side of center circuit band CCB#1 that is opposite to a side thereof adjacent to memory cell array MA#1D there is arranged a memory cell array MA#1U contained in the FIG. 9 memory block 320. More specifically, center circuit band CCB#1 is posed between memory cell array MA#1D and memory cell array MA#1U arranged opposite to memory cell array MA#1D. Similarly, center cross circuit band CCCB#2 is posed between sense amplifier band SAB#2D and sense amplifier band SAB#2U arranged opposite to sense amplifier band SAB#2D.

Similarly, center circuit band CCB#2 is posed between memory cell array MA#2D and memory cell array MA#2U arranged opposite to memory cell array MA#2D. In center circuit band CCB#1 are arranged an address latch circuit 344, a row predecode circuit 342, and row decoders 346 and 366. In center circuit band CCB#2 are arranged an address latch circuit 334, a row predecode circuit 332 and row decoders 336 and 356.

In center cross circuit band CCCB#2 are arranged column decode circuits 338 and 358 and sense amplifier control circuits 340 and 360.

Figure 11:
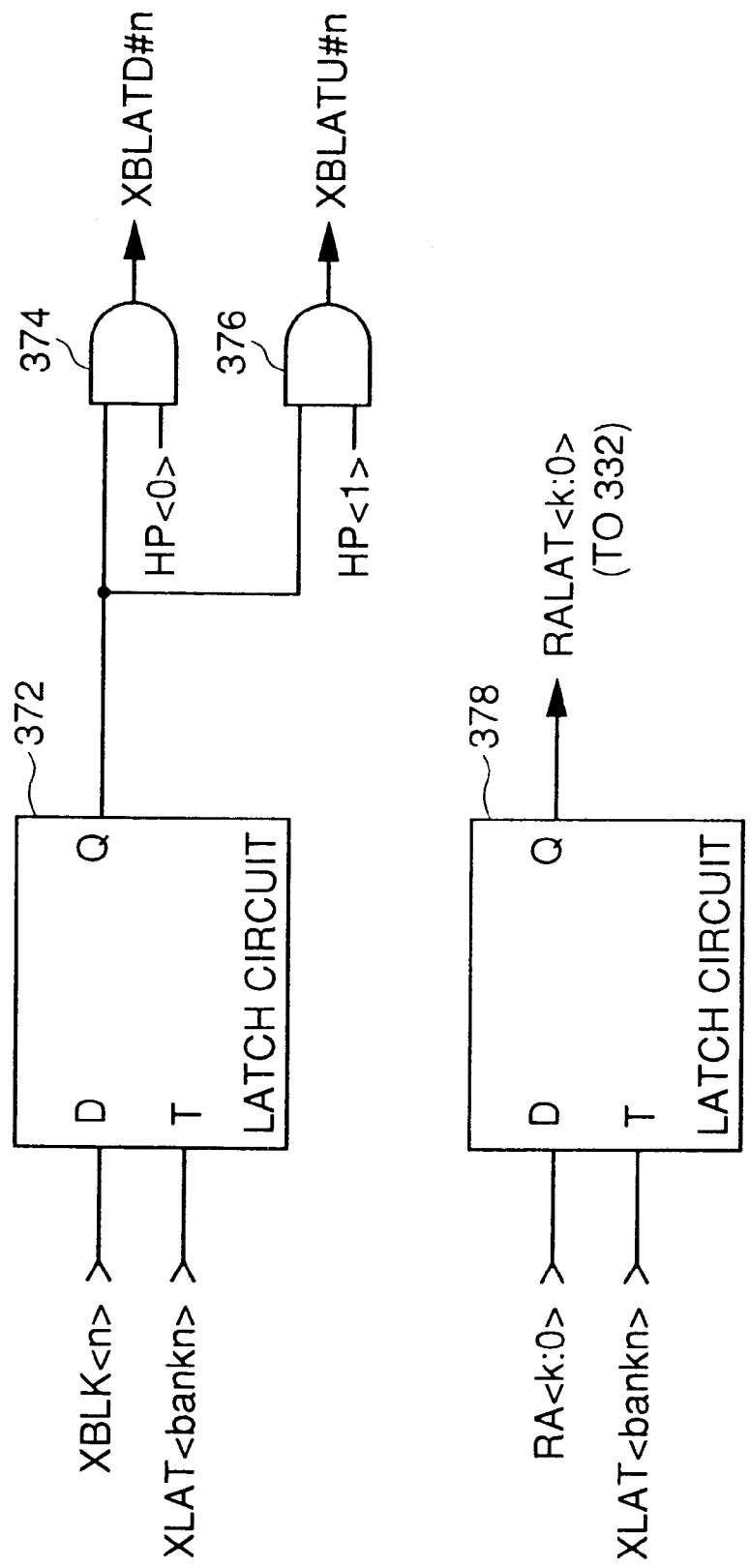
FIG. 11 is a circuit diagram showing a configuration of the FIG. 10 address latch circuit 334.

FIG. 11 is a circuit diagram showing a configuration of the FIG. 10 address latch circuit 334.

As shown in FIG. 11, address latch circuit 334 includes a latch circuit 372 latching block select signal XBLK<n> in synchronization with control signal XLAT<bankn> indicative of a timing of its latch operation, an AND circuit 374 receiving a signal output from latch circuit 372 and half page signal HP<0> and outputting signal XBLATD#n, an AND circuit 376 receiving a signal output from latch circuit 372 and half page signal HP<1> and outputting signal XBLATU#n, and a latch circuit 378 latching row address signal RA<k:0> in synchronization with signal XLAT<bankn>indicative of a timing of its latch operation and outputting signal RALAT<k:0> to row predecode circuit 332. Address latch circuit 334 is a latch circuit provided for memory cell arrays MA#2D and MA#2U and the FIG. 11 block select signal XBLK<n> corresponds to block select signal XBLK<2>. Furthermore, signals XBLATD#n, XBLATU#n correspond to signals XBLATD#2, XBLATU#2, respectively.

Referring again to FIG. 10, with half page signals HP<0> and HP<1> set logical high and low, respectively, address latch circuit 334 sets signals XBLATD#2 and XBLATU#2 high and low, respectively, when block select signal XBLK<2> is activated. Thus, column decode circuit 338 and sense amplifier control circuit 340 are activated and amplify data read from a memory cell, whereas column decode circuits 358 and 360 are inactivated.

Thus, a block select signal and a half page signal can be used to activate only a necessary control signal and minimize the number of circuits to be operated, so as to further reduce the power consumption of the device. As well as the first embodiment, the present embodiment can also have a reduced number of signals transmitted from a center circuit band to a center cross circuit band. As such, the number of memory cell arrays can be readily increased and in an ASIC, as a DRAM core a memory capacity can be readily increased and decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a main surface of a semiconductor substrate, comprising first to sixth regions arranged on said main surface in a matrix of three rows and two columns, each region being formed in a quadrangle, said first to third regions being arranged in a first column, said fourth to sixth regions being arranged in a second column adjacent to said first to third regions, respectively, said first and third regions respectively including first and second memory cell arrays each formed in a quadrangle and having therein a plurality of memory cells arranged in rows and columns, said second region including a first sense amplifier band arranged between and shared by said first and second memory cell arrays, provided in a rectangle having first and second longer sides in contact with said first and second memory cell arrays, respectively, said fourth and sixth regions including first and second row decoders provided for said first and second memory cell arrays, respectively, to select a row of memory cells, said fifth region including a first column decoder selecting a column of said first and second memory cell arrays and a first sense amplifier control circuit outputting a control signal to said first sense amplifier band.

2. The semiconductor memory device according to claim 1, wherein:

said first memory cell array includes a first bit line pair provided corresponding to a first column of memory cells of said plurality of memory cells;

said second memory cell array includes a second bit line pair provided corresponding to a second column of memory cells of said plurality of memory cells;

said first sense amplifier band includes a first sense amplifier circuit provided for said first and second bit line pairs, activated in response to a sense amplifier activation signal to amplify data read on said first and second bit line pairs, a first gate circuit turning on/off in response to a first isolation signal, connecting said first sense amplifier and said first bit line pair together when said first gate circuit turns on, and a second gate circuit turning on/off in response to a second isolation signal, connecting said first sense amplifier and said second bit line pair together when said second gate circuit turns on.

3. The semiconductor memory device according to claim 2, wherein said first sense amplifier control circuit includes a drive circuit driving said sense amplifier activation signal.

4. The semiconductor memory device according to claim 2, wherein said first sense amplifier control circuit includes first and second drive circuits driving said first and second isolation signals.

5. The semiconductor memory device according to claim 2, wherein:

said first sense amplifier band further includes a first equalizer circuit equalizing said first bit line pair in response to a first equalization signal, and a second equalizer circuit equalizing said second bit line pair in response to a second equalization signal; and said first sense amplifier control circuit includes first and second drive circuits driving said first and second equalization signals.

6. The semiconductor memory device according to claim 1, wherein:
said fourth region further includes a first hold circuit holding a first block select signal corresponding to said first memory cell array;
said sixth region further includes a second hold circuit holding a second block select signal corresponding to said second memory cell array; and
said sense amplifier control circuit outputs said control signal in response to a signal output from said first and second hold circuits.

7. The semiconductor memory device according to claim 6, wherein:
said first memory cell array includes a first bit line pair provided corresponding to a first column of memory cells of said plurality of memory cells;
said second memory cell array includes a second bit line pair provided corresponding to a second column of memory cells of said plurality of memory cells;
said first sense amplifier band includes
  a first sense amplifier circuit provided for said first and second bit line pairs, activated in response to a sense amplifier activation signal to amplify data read on said first and second bit line pairs,
  a first gate circuit turning on/off in response to a first isolation signal, connecting said first sense amplifier and said first bit line pair together when said first gate circuit turns on,
  a second gate circuit turning on/off in response to a second isolation signal, connecting said first sense amplifier and said second bit line pair together when said second gate circuit turns on,
  a first equalizer circuit equalizing said first bit line pair in response to a first equalization signal, and
  a second equalizer circuit equalizing said second bit line pair in response to a second equalization signal; and
said sense amplifier circuit has
  a first drive circuit inactivating said first equalization signal in response to a signal output from said first hold circuit,
  a second drive circuit activating said second isolation signal in response to a signal output from said first hold circuit,
  a third drive circuit inactivating said second equalization signal in response to a signal output from said second hold circuit,
  a fourth drive circuit activating said first isolation signal in response to a signal output from said second hold circuit, and
  a fifth drive circuit driving said sense amplifier activation signal in response to a signal output from said first and second hold circuits.

8. The semiconductor memory device according to claim 1, further comprising seventh to ninth regions on said main surface, said fourth to sixth regions being posed between said first to third regions and said seventh to ninth regions, respectively,
said seventh and ninth regions respectively including third and fourth memory cell arrays each formed in a quadrangle and having therein a plurality of memory cells arranged in rows and columns,
said eighth region including a rectangular, first sense amplifier band arranged between and shared by said third and fourth memory cell arrays,
said fourth and sixth regions further including third and fourth row decoders provided for said third and fourth memory cell arrays, respectively, to select a memory cell row,
said fifth region further including a second column decoder selecting a column of said third and fourth memory cell arrays and a second sense amplifier control circuit outputting a control signal to said second sense amplifier band.

9. The semiconductor memory device according to claim 8, wherein:
said fourth region further includes a first hold circuit holding a first block select signal used commonly in selecting said first and third memory cell arrays;
said sixth region further includes a second hold circuit holding a second block select signal used commonly in selecting said second and fourth memory cell arrays; and
said first and second sense amplifier control circuits output said control signal in response to a signal output from said first hold circuit and a signal output from said second hold circuit, respectively.

10. The semiconductor memory device according to claim 9, wherein:
said fourth region further includes
  a first gate circuit receiving a signal output from said first hold circuit and, in response to a first region select signal, transmitting the signal received from said first hold circuit to said first sense amplifier control circuit, and
  a second gate circuit receiving a signal output from said first hold circuit and, in response to a second region select signal, transmitting the signal received from said first hold circuit to said second sense amplifier control circuit; and
said sixth region further includes
  a third gate circuit receiving a signal output from said second hold circuit and, in response to a first region select signal, transmitting the signal received from said second hold circuit to said first sense amplifier control circuit, and
  a fourth gate circuit receiving a signal output from said second hold circuit and, in response to a second region select signal, transmitting the signal received from said second hold circuit to said second sense amplifier control circuit.

* * * * *